United States Patent
Matsuo et al.

[19]

[11] Patent Number: 5,928,840
[45] Date of Patent: Jul. 27, 1999

[54] PATTERNING MATERIAL AND PATTERNING METHOD

[75] Inventors: Takahiro Matsuo, Kyoto; Masayuki Endo, Osaka; Masamitsu Shirai, Osaka; Masahiro Tsunooka, Osaka, all of Japan

[73] Assignee: Matsushita Electric Industrial Co., Ltd., Osaka, Japan

[ * ] Notice: This patent is subject to a terminal disclaimer.

[21] Appl. No.: 08/743,604

[22] Filed: Nov. 4, 1996

[30] Foreign Application Priority Data

Nov. 10, 1995 [JP] Japan .................. 7-292988

[51] Int. Cl.[6] .................. G03F 7/36; G03F 7/40
[52] U.S. Cl. .................. 430/324; 430/313; 430/325; 430/330
[58] Field of Search .................. 430/323, 324, 430/325, 330, 291, 313

[56] References Cited

U.S. PATENT DOCUMENTS

| | | | |
|---|---|---|---|
| 4,869,995 | 9/1989 | Shirai et al. | 430/270.1 |
| 5,066,566 | 11/1991 | Novembre | 430/296 |
| 5,278,029 | 1/1994 | Shirai et al. | 430/325 |
| 5,658,711 | 8/1997 | Matsuo et al. | 430/324 |
| 5,741,628 | 4/1998 | Matsuo et al. | 430/323 |

FOREIGN PATENT DOCUMENTS

| | | |
|---|---|---|
| 0 473 547 | 3/1992 | European Pat. Off. . |
| 0 515 212 | 11/1992 | European Pat. Off. . |
| 0 519 128 | 12/1992 | European Pat. Off. . |

*Primary Examiner*—John S. Chu
*Attorney, Agent, or Firm*—McDermott, Will & Emery

[57] ABSTRACT

A patterning material includes a polymer represented by a general formula:

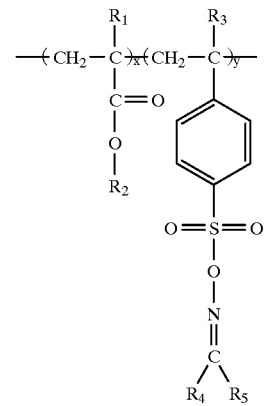

wherein $R_1$ indicates a hydrogen atom or an alkyl group; $R_2$ indicates a hydrophobic protecting group which is easily desorbed through a function of an acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of $0<x<1$; and y satisfies a relationship of $0<y<1$.

14 Claims, 8 Drawing Sheets

PATTERNING MATERIAL AND PATTERNING METHOD

BACKGROUND OF THE INVENTION

The present invention relates to a fine-line patterning method for use in the manufacture of a semiconductor IC device and the like and a patterning material used in the patterning method.

In manufacturing a semiconductor device including semiconductor elements such as an IC and an LSI, patterning is conventionally effected through photolithography using UV, where a light source with a shorter wavelength is used as the semiconductor devices are more refined. In the application of a light source with a short wavelength, a surface imaging process using dry development has recently been developed in order to increase the depth of focus and improve practical resolution.

As an example of the surface resolving process, U.S. Pat. No. 5,278,029 discloses a method in which, after selectively forming an oxide film of polysiloxane on the surface of a resist film of a resist material which can produce an acid through exposure, the resist film is dry etched, so as to form a resist pattern.

Now, this method of forming the resist pattern will be described with reference to FIGS. 6(a), 6(b), 7(a) and 7(b).

In the following description, a copolymer of 1,2,3,4-tetrahydronaphthyridinenimino-p-styrene sulfonate (NISS) and methyl methacrylate (MMA) is used as the resist material which can produce an acid through exposure.

First, as is shown in FIG. 6(a), a resist film 51 of the resist material, which can produce an acid through exposure, formed on a semiconductor substrate 50 is irradiated with a KrF excimer laser 53 by using a mask 52, thereby producing an acid in exposed areas 51a of the resist film 51. This acid provides the exposed areas 51a with hydrophilicity, and hence, the exposed areas 51a can easily adsorb a water content of air. Accordingly, a natural adsorbing layer 54 with a small thickness, where water is adsorbed, is formed on the surface of each exposed area 51a as shown in FIG. 6(b).

Next, when an alkoxysilane gas is introduced onto the surface of the resist film 51, the acid included in the natural adsorbing layer 54 formed on the exposed area 51a works as a catalyst, so that alkoxysilane is hydrolyzed and dehydrated. As a result, an oxide film 55 is formed on the surface of each exposed area 51a as is shown in FIG. 7(a). Then, by using the oxide film 55 as a mask, the resist film 51 is dry etched by RIE using $O_2$ plasma 56. Thus, a fine-line resist pattern 57 is formed as is shown in FIG. 7(b).

However, when the resist pattern is formed in the aforementioned manner, the oxide film 55 flows during its growth as is shown in FIG. 8. This disadvantageously enlarges the edge roughness of the oxide film 55.

In particular when the pattern pitch is more refined, edge roughness such as a bridge striding patterns can occur, resulting in degrading the dimensional accuracy of the resist pattern 57.

SUMMARY OF THE INVENTION

In view of the aforementioned problems, the object of the invention is improving the dimensional accuracy of a resist pattern by improving edge roughness of an oxide film formed on the surface of each exposed area of the resist-film.

The present inventors made various examination on the cause of disturbance of the shape of the oxide film 55 and found the following two causes:

First, the shape of the oxide film 55 is disturbed owing to low contrast, obtained by the exposure, in the change of the property of the resist film from hydrophobicity into hydrophilicity. Specifically, as is shown in Chemical Formula 1, sulfonic acid having a strong hydrophilic property is produced in the exposed area of the resist film 51, resulting in changing the property of the exposed area of the resist film 51 from hydrophobicity into hydrophilicity.

Chemical Formula 1:

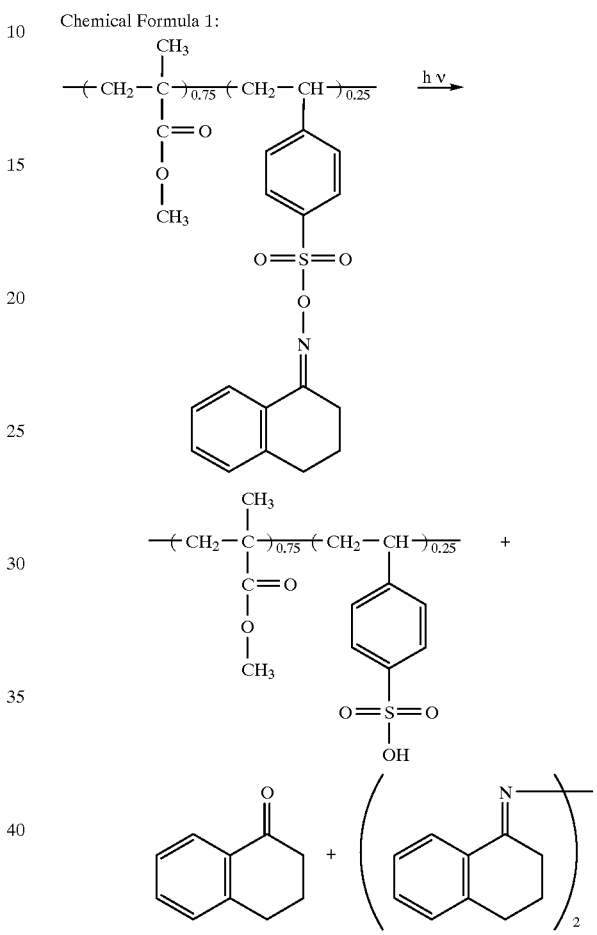

However, as is shown in Chemical Formula 1, not only hydrophilic sulfonic acid is produced in each exposed area 51a of the resist film 51, but also a byproduct of hydrophobic tetralone and tetralone azine is produced therein. Therefore, the hydrophilic property of the exposed area 51a of the resist film 51 is weakened by such a byproduct. Also, since the proportion of MMA, which remains to be hydrophobic even after the exposure, is large as compared with that of NISS, which is changed to be hydrophilic through the exposure, the degree of hydrophilicity of the entire exposed area 51a in the resist film 51 is small. In addition, since the copolymer of NISS and MMA included in the resist film 51 inherently has a weak hydrophobic property, the contrast in the change of the property between the unexposed area 51b (hydrophobicity) and the exposed area 51a (hydrophilicity) is low, and hence, not only the exposed area 51a adsorbs water but also the unexposed area 51b adsorbs a small amount of water. As a result, as is shown in FIG. 6(b), the natural adsorbing layer 54 is formed over the boundary between the exposed area 51a and the unexposed area 51b, and is unavoidably formed also on the unexposed area 51b.

As described above, the acid included in the natural adsorbing layer 54 works as a catalyst to form the oxide film 55 on the surface of each exposed area 51a. However, the natural adsorbing layer 54 is formed also on the unexposed area 51b, and hence, when the alkoxysilane gas is introduced, the oxide film 55 is formed also on the surface of the unexposed area 51b as is shown in FIG. 8. In this manner, the shape of the oxide film 55 depends upon the shape of the natural adsorbing layer 54. Accordingly, the edge roughness of the pattern of the oxide film 55 is caused by disturbance of the shape of the natural adsorbing layer 54 derived from the low contrast in the change of the property through the exposure.

Secondly, the oxide film 55 is formed through change of an oligomer of siloxane with a low molecular weight into a polymer of siloxane with a high molecular weight. At the initial stage of the growth of the oxide film 55, the amount of the oligomer is large, and hence, the oxide film 55 tends to flow.

The present invention was devised on the basis of the aforementioned knowledge. In order to increase the contrast between an exposed area and an unexposed area in a resist film, a polymer including a group which can be decomposed into a hydrophilic group under an atmosphere of an acid is used as a resist material. Thus, the contrast in the change of the property of the resist film through the exposure can be increased.

The patterning material of this invention comprises a polymer including a first group for producing an acid through exposure; and a second group which is decomposed into a hydrophilic group under an atmosphere of said acid.

When this patterning material is exposed, the first group produces an acid to attain an atmosphere of the acid in an exposed area, resulting in decomposing the second group into the hydrophilic group. Accordingly, the exposed area can be definitely changed to be hydrophilic because the degree of the change of the property therein is large. Thus, the contrast between an unexposed area, which remains to be hydrophobic, and the exposed area, which has been changed to be greatly hydrophilic, can be increased.

In one aspect of the patterning material, the polymer is preferably represented by a general formula:

Chemical Formula 2:

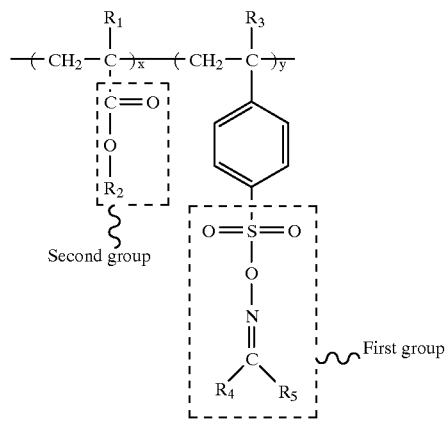

wherein $R_1$ indicates a hydrogen atom or an alkyl group; $R_2$ indicates a hydrophobic protecting group which is easily desorbed through a function of the acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of $0<x<1$; and y satisfies a relationship of $0<y<1$. In this case, since $0<x<1$ and $0<y<1$, the polymer represented by Chemical Formula 2 includes a ternary or higher polymer in addition to a binary polymer.

In this case, the first group is decomposed to produce hydrophilic sulfonic acid in the exposed area. Also, when heated, the protecting group which has protected a carbonyl group of the second group is desorbed through the function of the acid produced from the first group, so as to produce hydrophilic carboxylic acid and a hydrophobic byproduct, but the hydrophobic byproduct is evaporated through the heating process. Thus, in the exposed area, hydrophilic sulfonic acid is produced, hydrophilic carboxylic acid is produced, and the hydrophobic byproduct is evaporated, resulting in increasing the degree of the property change of the exposed area into hydrophilicity. As a result, the contrast between the exposed area and the unexposed area is further increased.

In Chemical Formula 2, $R_4$ and $R_5$ preferably together indicate a cyclic alkyl or alkenyl group having two or more phenyl groups.

In Chemical Formula 2, x and y preferably satisfy relationships of $x+y=1$ and $0.01 \leq y \leq 0.5$.

In another aspect of the patterning material, the polymer is preferably represented by a general formula:

Chemical Formula 3:

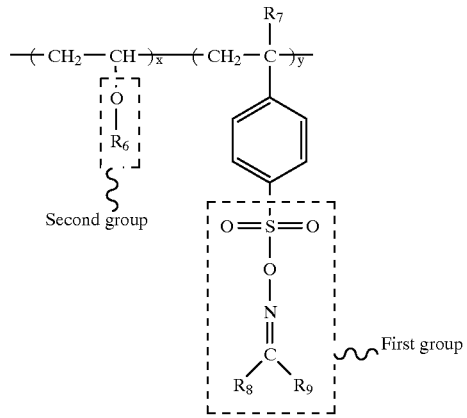

wherein $R_6$ indicates a hydrophobic protecting group which is easily desorbed through a function of the acid; $R_7$ indicates a hydrogen atom or an alkyl group; $R_8$ and $R_9$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of $0<x<1$; and y satisfies a relationship of $0<y<1$. In this case, since $0<x<1$ and $0<y<1$, the polymer represented by Chemical Formula 3 includes a ternary or higher polymer in addition to a binary polymer.

In this case, in the exposed area, the first group is decomposed into hydrophilic sulfonic acid. Also, when heated, the protecting group of the second group is desorbed through the function of the acid produced from the first group, so as to produce hydrophilic vinyl alcohol and a hydrophobic byproduct, but the hydrophobic byproduct is evaporated through the heating process. Thus, in the exposed area, hydrophilic sulfonic acid is produced, hydrophilic vinyl alcohol is produced, and the hydrophobic byproduct is evaporated, resulting in creasing the degree of the property change of the exposed area into hydrophilicity. As a result, the contrast between the unexposed area and the exposed area is further increased.

In Chemical Formula 3, $R_8$ and $R_9$ preferably together indicate a cyclic alkyl or alkenyl group including two or more phenyl groups.

In Chemical Formula 3, x and y preferably satisfy relationships of $x+y=1$ and $0.01 \leq y \leq 0.5$.

In still another aspect of the patterning material, the polymer is preferably represented by a general formula:

Chemical Formula 4:

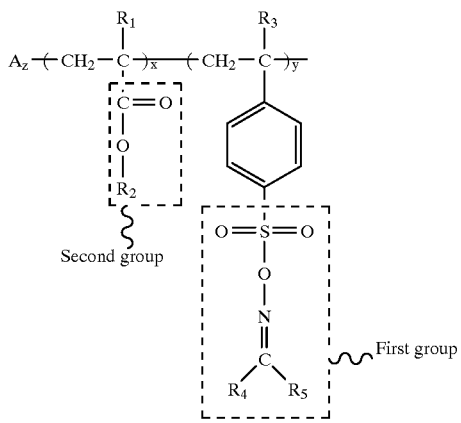

wherein $A_z$ indicates a group of an organic compound; $R_1$ indicates a hydrogen atom or an alkyl group; $R_2$ indicates a hydrophobic protecting group which is easily desorbed through a function of the acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group, or a cyclic alkyl or alkenyl group having a phenyl group; and x, y and z satisfy a relationship of $x+y+z=1$.

In this case, in the exposed area, the first group is decomposed into hydrophilic sulfonic acid. Also, when heated, the protecting group which has protected a carbonyl group of the second group is desorbed through the function of the acid produced from the first group, so as to produce hydrophilic carboxylic acid and a hydrophobic byproduct, but the hydrophobic byproduct is evaporated through the heating process. Thus, in the exposed area, hydrophilic sulfonic acid is produced, hydrophilic carboxylic acid is produced, and the hydrophobic byproduct is evaporated, resulting in increasing the degree of the property change of the exposed area into hydrophilicity. As a result, the contrast between the unexposed area and the exposed area is further increased.

In Chemical Formula 4, $R_4$ and $R_5$ preferably together indicate a cyclic alkyl or alkenyl group having two or more phenyl groups.

In Chemical Formula 4, y preferably satisfies a relationship of $0.01 \leq y \leq 0.5$.

In still another aspect of the patterning material, the polymer is preferably represented by a general formula:

Chemical Formula 5:

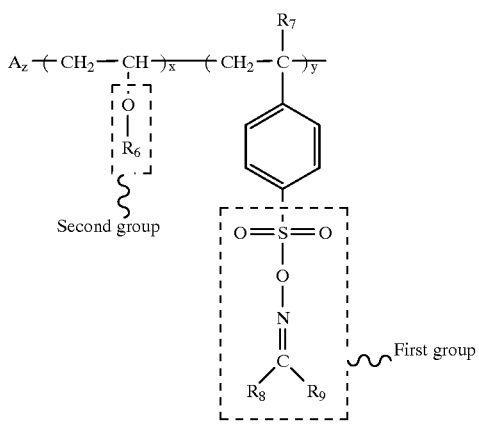

wherein $A_z$ indicates a group of an organic compound; $R_6$ indicates a hydrophobic protecting group which is easily desorbed through a function of the acid; $R_7$ indicates a hydrogen atom or an alkyl group; $R_8$ and $R_9$ independently indicate a hydrogen atom, an alkyl group, a phenyl group or an alkenyl group, or together indicate a cyclic alkyl group, a cyclic alkenyl group, or a cyclic alkyl or alkenyl group having a phenyl group; and x, y and z satisfy a relationship of $x+y+z=1$.

In this case, in the exposed area, the first group is decomposed into hydrophilic sulfonic acid. Also, when heated, the protecting group of the second group is desorbed through the function of the acid produced from the first group, so as to produce hydrophilic vinyl alcohol and a hydrophobic byproduct, but the hydrophobic byproduct is evaporated through the heating process. Thus, in the exposed area, hydrophilic sulfonic acid is produced, hydrophilic vinyl alcohol is produced, and the hydrophobic byproduct is evaporated, resulting in increasing the degree of the property change of the exposed area into hydrophilicity. As a result, the contrast between the unexposed area and the exposed area is further increased.

In Chemical Formula 5, $R_8$ and $R_9$ preferably together indicate a cyclic alkyl or alkenyl group having two or more phenyl groups.

In Chemical Formula 5, y preferably satisfies a relationship of $0.01 \leq y \leq 0.5$.

The patterning method of this invention comprises a first step of forming a resist film by coating a patterning material, which comprises a polymer including a first group for producing an acid through exposure and a second group which is decomposed into a hydrophilic group under an atmosphere of the acid, on a semiconductor substrate; a second step of producing the acid in an exposed area of the resist film by irradiating the resist film with an energy beam; a third step of changing the second group present in the exposed area of the resist film into the hydrophilic group by heating the resist film, on which a pattern has been exposed through the second step; a fourth step of forming a metal oxide film on a surface of the exposed area by supplying metal alkoxide onto the surface of the exposed area of the resist film, which has been heated in the third step; and a fifth step of forming a resist pattern of the resist film by dry etching the resist film by using the metal oxide film as a mask.

In the patterning method of this invention, when the resist film is irradiated with the energy beam, the first group in an exposed area is decomposed to produce a hydrophilic acid. When the resist film is then heated, the hydrophobic protecting group is desorbed to produce a hydrophilic group. This increases the number of the hydrophilic groups in each exposed area of the resist film as compared with that in the conventional resist film, and hence, the degree of hydrophilicity in the exposed area is increased. As a result, the contrast between the hydrophobic unexposed area and the exposed area which has been changed to be greatly hydrophilic is increased. Accordingly, the natural adsorbing layer of water is formed on the exposed area alone. Therefore, when metal alkoxide is supplied, the metal oxide film can be definitely formed on the surface of the exposed area alone.

Also, in the exposed area, the volume of the resist material is decreased because of the desorption of the protecting group, so as to form a latent image on the exposed area. This results in forming a recess on the surface of the exposed area, and the metal oxide film formed on the surface of the exposed area is prevented from flowing owing to the recess.

In this manner, after the exposing process and the heating process, the number of the hydrophilic groups in each exposed area of the resist film is increased as compared with that in the conventional resist film. This increases the contrast between the hydrophobic unexposed area and the exposed area which has been changed to be greatly hydrophilic. As a result, in the process to supply metal alkoxide, edge roughness such as a bridge striding patterns can be prevented from occurring in the metal oxide film formed on the surface of the exposed area alone. Also, the metal oxide film formed on the surface of the exposed area is prevented from flowing by the recess formed as the latent image on the surface of the exposed area. Accordingly, the patterning method of this invention can improve the dimensional accuracy of the resist pattern.

The patterning method of this invention preferably further comprises, between the third step and the fourth step, a step of allowing the exposed area of the resist film to adsorb water.

In this case, water is adsorbed by the exposed area which has been changed to be hydrophilic, and the adsorbed water is diffused into a deep portion from the surface in the exposed area. As a result, the metal oxide film formed on the exposed area can attain a large thickness, which decreases a damage which can occur in the etching process. Thus, the dimensional accuracy of the resist pattern can be further improved.

In one aspect of the patterning method, the polymer is preferably represented by a general formula:

Chemical Formula 6:

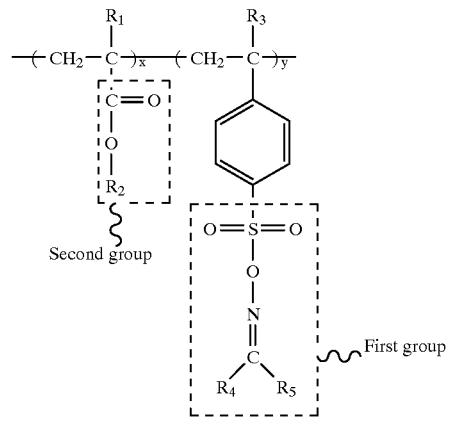

wherein $R_1$ indicates a hydrogen atom or an alkyl group; $R_2$ indicates a hydrophobic protecting group which is easily desorbed through a function of the acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of $0<x<1$; and y satisfies a relationship of $0<y<1$. In this case, since $0<x<1$ and $0<y<1$, the polymer represented by Chemical Formula 6 includes a ternary or higher polymer in addition to a binary polymer.

In this case, in the exposed area, the first group is decomposed into hydrophilic sulfonic acid. Also, when heated, the hydrophobic protecting group which has protected a carbonyl group of the second group is desorbed through the function of the acid produced from the first group, so as to produce hydrophilic carboxylic acid and a hydrophobic byproduct, but the hydrophobic byproduct is evaporated through the heating process. Thus, in the exposed area, hydrophilic sulfonic acid is produced, hydrophilic carboxylic acid is produced and the hydrophobic byproduct is evaporated, resulting in increasing the degree of the property change of the exposed area into hydrophilicity. As a result, the contrast between the unexposed area and the exposed area is further increased, and hence, the edge roughness of the metal oxide film formed on the surface of the exposed area by supplying metal alkoxide can be further improved.

In Chemical Formula 6, $R_4$ and $R_5$ preferably together indicate a cyclic alkyl or alkenyl group having two or more phenyl groups.

In Chemical Formula 6, x and y preferably satisfy relationships of $x+y=1$ and $0.01 \leq y \leq 0.5$.

In another aspect of the patterning method, the polymer is preferably represented by a general formula:

Chemical Formula 7:

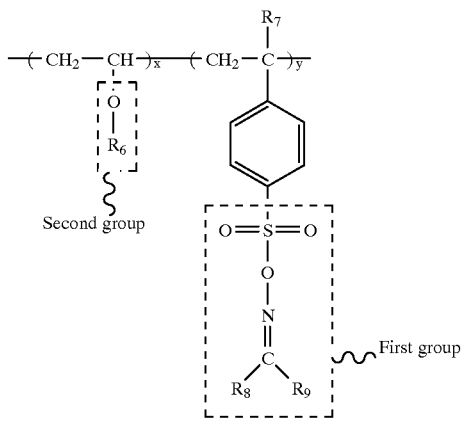

Chemical Formula 8:

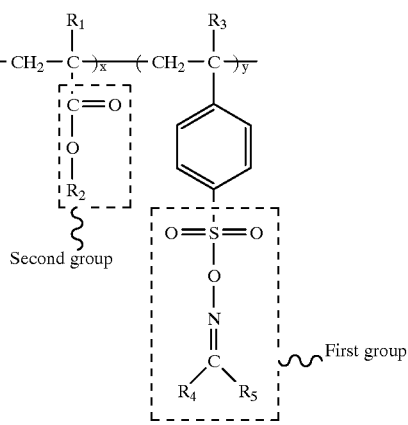

wherein $R_6$ indicates a hydrophobic protecting group which is easily desorbed through a function of the acid; $R_7$ indicates a hydrogen atom or an alkyl group; $R_8$ and $R_9$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of 0<x<1; and y satisfies a relationship of 0<y<1. In this case, since 0<x<1 and 0<y<1, the polymer represented by Chemical Formula 7 includes a ternary or higher polymer in addition to a binary polymer.

In this case, in the exposed area, the first group is decomposed into hydrophilic sulfonic acid. Also, when heated, the protecting group of the second group is desorbed through the function of the acid produced from the first group, so as to produce hydrophilic vinyl alcohol and a hydrophobic byproduct, but the hydrophobic byproduct is evaporated through the heating process. Thus, in the exposed area, hydrophilic sulfonic acid is produced, hydrophilic vinyl alcohol is produced, and the hydrophobic byproduct is evaporated, resulting in further increasing the degree of the property change of the exposed area into hydrophilicity. As a result, the contrast between the unexposed area and the exposed area is further increased, and hence, the edge roughness of the metal oxide film formed on the surface of the exposed area by supplying metal alkoxide can be further improved.

In Chemical Formula 7, $R_8$ and $R_9$ preferably together indicate a cyclic alkyl or alkenyl group having two or more phenyl groups.

In Chemical Formula 7, x and y preferably satisfy relationships of x+y=1 and $0.01 \leq y \leq 0.5$.

In still another aspect of the patterning method, the polymer is preferably represented by a general formula:

wherein $A_z$ indicates a group of an organic compound; $R_1$ indicates a hydrogen atom or an alkyl group; $R_2$ indicates a hydrophobic protecting group which is easily desorbed through a function of the acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group, or a cyclic alkyl or alkenyl group having a phenyl group; and x, y and z satisfy a relationship of x+y+z=1.

In this case, in the exposed area, the first group is decomposed into hydrophilic sulfonic acid. Also, when heated, the hydrophobic protecting group which has protected a carbonyl group of the second group is desorbed, so as to produce hydrophilic carboxylic acid and a hydrophobic byproduct, but the hydrophobic byproduct is evaporated through the heating process. Thus, in the exposed area, hydrophilic sulfonic acid is produced, hydrophilic carboxylic acid is produced, and the hydrophobic byproduct is evaporated, resulting in further increasing the degree of the property change of the exposed area into hydrophilicity. As a result, the contrast between the unexposed area and the exposed area is further increased, and hence, the edge roughness of the metal oxide film formed on the surface of the exposed area by supplying metal alkoxide can be further improved.

In Chemical Formula 8, $R_4$ and $R_5$ preferably together indicate a cyclic alkyl or alkenyl group having two or more phenyl groups.

In Chemical Formula 8, y preferably satisfies a relationship of $0.01 \leq y \leq 0.5$.

In still another aspect of the patterning method, the polymer is preferably represented by a general formula:

Chemical Formula 9:

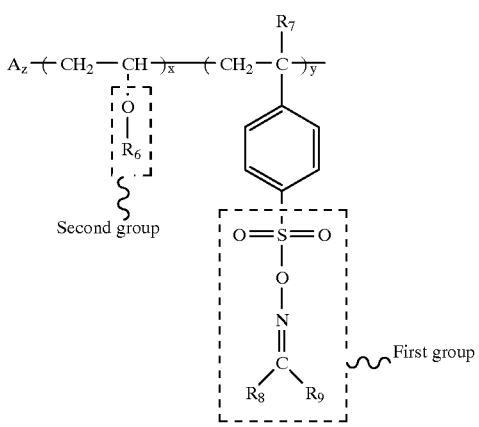

wherein $A_z$ indicates a group of an organic compound; $R_6$ indicates a hydrophobic protecting group which is easily desorbed through a function of the acid; $R_7$ indicates a hydrogen atom or an alkyl group; $R_8$ and $R_9$ independently indicate a hydrogen atom, an alkyl group, a phenyl group or an alkenyl group, or together indicate a cyclic alkyl group, a cyclic alkenyl group, or a cyclic alkyl or alkenyl group having a phenyl group; and x, y and z satisfy a relationship of x+y+z=1.

In this case, in the exposed area, the first group is decomposed into hydrophilic sulfonic acid. Also, when heated, the protecting group of the second group is desorbed through the function of the acid produced from the first group, so as to produce hydrophilic vinyl alcohol and a hydrophobic byproduct, but the hydrophobic byproduct is evaporated through the heating process. Thus, in the exposed area, hydrophilic sulfonic acid is produced, hydrophilic vinyl alcohol is produced, and the hydrophobic byproduct is evaporated, resulting in further increasing the degree of the property change of the exposed area into hydrophilicity. As a result, the contrast between the unexposed area and the exposed area is further increased, and hence, the edge roughness of the metal oxide film formed on the surface of the exposed area by supplying metal alkoxide can be further improved.

In Chemical Formula 9, $R_8$ and $R_9$ preferably together indicate a cyclic alkyl or alkenyl group having two or more phenyl groups.

In Chemical Formula 9, y preferably satisfies a relationship of $0.01 \leq y \leq 0.5$.

In any of the aspects of the patterning material and the patterning method, when $R_4$ and $R_5$ in Chemical Formula 2, $R_8$ and $R_9$ in Chemical Formula 3, $R_4$ and $R_5$ in Chemical Formula 4, $R_8$ and $R_9$ in Chemical Formula 5, $R_4$ and $R_5$ in Chemical Formula 6, $R_8$ and $R_9$ in Chemical Formula 7, $R_4$ and $R_5$ in Chemical Formula 8, and $R_8$ and $R_9$ in Chemical Formula 9 together indicate a cyclic alkyl or alkenyl group having two or more phenyl groups, the hydrophobic property of the unexposed area can be enhanced. Therefore, the contrast between the unexposed area and the exposed area is further increased.

In any of the aspects of the patterning material and the patterning method, when y in Chemical Formula 2, 3, 4, 5, 6, 7, 8 or 9 satisfies the relationship of $0.01 \leq y \leq 0.5$, not only solubility of the polymer in a solvent is improved but also adhesion of the polymer onto the semiconductor substrate is improved. Therefore, the resultant resist film can attain excellent adhesion where no peeling occurs.

DETAILED DESCRIPTION OF THE INVENTION (Embodiment 1)

A method of forming a resist pattern according to a first embodiment of the invention will now be described with reference to FIGS. 1(a), 1(b), 2(a) and 2(b).

As a resist material, a copolymer represented by Chemical Formula 10 is dissolved in diglyme. As a protecting group $R_{10}$ in Chemical Formula 10, a protecting group represented by Chemical Formula 11 is used. The copolymer represented by Chemical Formula 10 has a large number of benzene rings in a hydrophobic group, and hence, its hydrophobic property is improved as compared with that of a conventionally used material.

Chemical Formula 10:

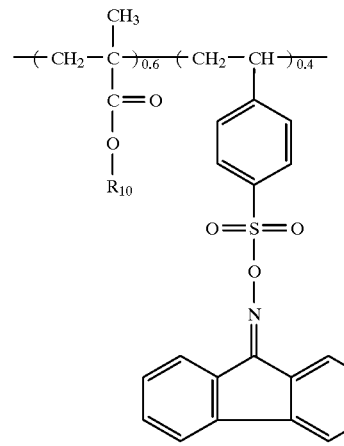

Chemical Formula 11:

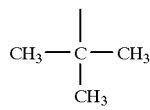

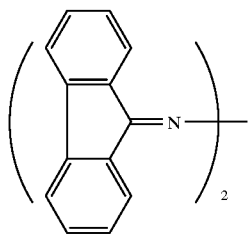

Figure 1A:
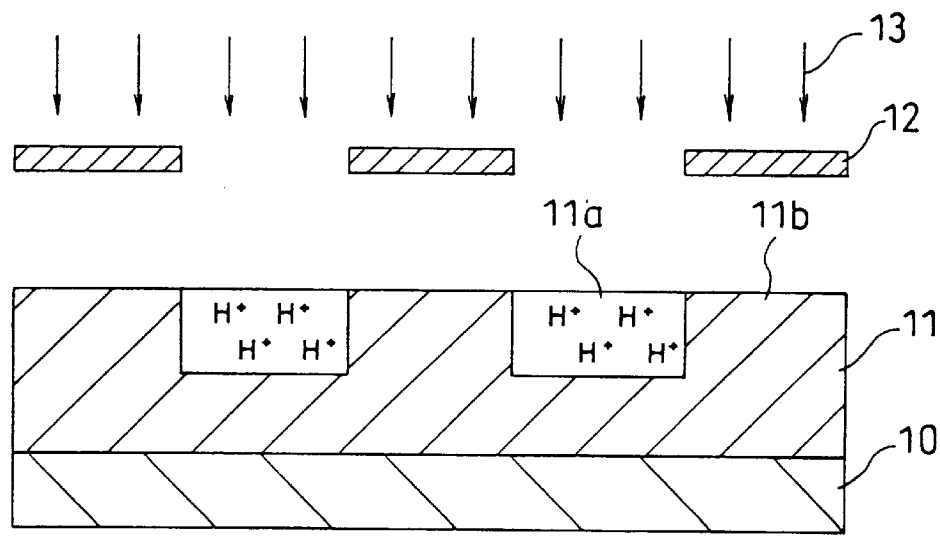
FIGS. 1(a) and 1(b) are sectional views for showing procedures in a patterning method according to a first embodiment.

First, as is shown in FIG. 1(a), the resist material is coated on a semiconductor substrate 10 of silicon by spin coating, and the coated resist material is heated at a temperature of 90° C. for 90 seconds, thereby forming a resist film 11 with a thickness of 1 μm. At this point, peeling or the like does not occur in the resist film and the obtained resist film 11 has good adhesion. Then, the resist film 11 is irradiated with a KrF excimer laser 13 as an energy beam by using a mask 12, thereby exposing a pattern corresponding to the mask 12 onto the resist film 11. In this manner, on the surface of each exposed area 11a of the resist film 11, 9-fluorenilideneimino-p-styrenesulfonate (FISS) is decomposed to produce an acid. After the exposure, the semiconductor substrate 10 is heated at a temperature of 140° C. for 1 minute. A reaction formula obtained through the heating process after the exposure of the resist film is shown as Chemical Formula 12.

Chemical Formula 12:

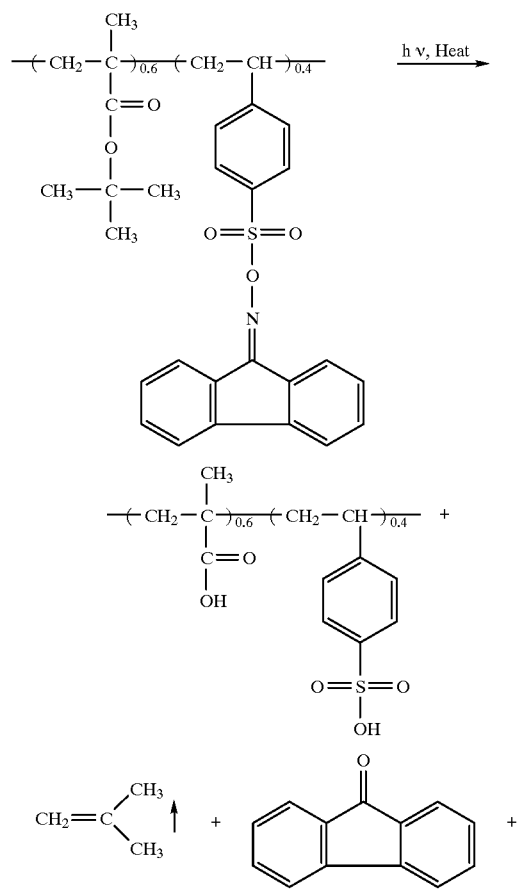

In the exposing process, a hydrophobic FISS group is decomposed to produce hydrophilic sulfonic acid, and in the heating process after the exposure, the protecting group represented by Chemical Formula 11 is desorbed through the function of the acid to produce hydrophilic carboxylic acid. Furthermore, as is shown in the reaction formula of Chemical Formula 12, the protecting group represented by Chemical Formula 11 is desorbed from the compound of Chemical Formula 10, so as to produce a hydrophobic byproduct and other byproducts, and the hydrophobic byproduct is evaporated during the heating process.

Through the aforementioned reactions, hydrophilic sulfonic acid is produced, hydrophilic carboxylic acid is produced through the desorption of the protecting group, and the hydrophobic byproduct is evaporated. In addition, since the resist material has the improved hydrophobic property as compared with the conventionally used resist material as described above, the property of each exposed area can be changed from hydrophobicity into hydrophilicity to a larger extent than in the conventional resist material. In other words, the exposed area 11a alone can attain a strong hydrophilic property on the resist film 11 while retaining the strong hydrophobic property in an unexposed area 11b.

Figure 3:
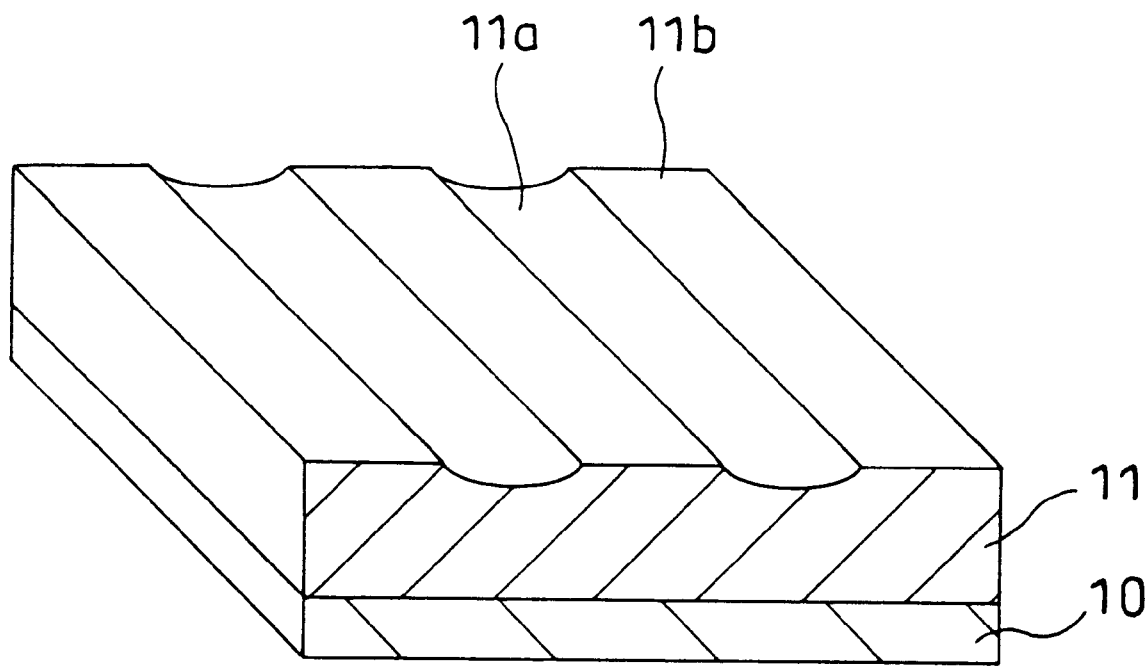
FIG. 3 is a sectional perspective view of a latent image on the surface of a resist film formed by the patterning method of the first embodiment.

Furthermore, in the heating process after the exposure, the volume of each exposed area 11a of the resist film 11 is decreased because of the desorption of the protecting group. As a result, a latent image is formed on the surface of each exposed area 11a of the resist film 11 as is shown in FIG. 3. Observation of the surface of the resist film 11 with an AFM reveals that a recess with a depth of 60 nm is formed on the surface of each exposed area 11a of the resist film 11.

Figure 1B:
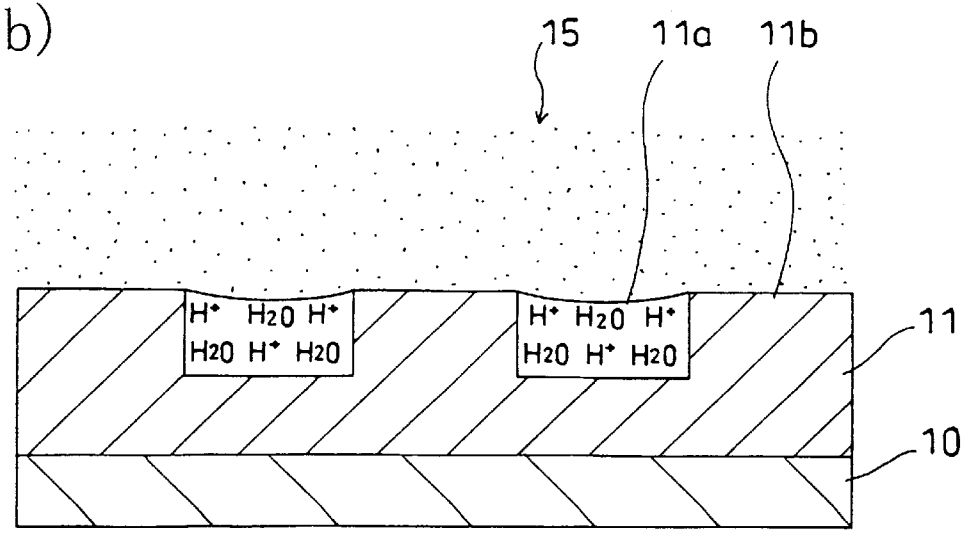

Then, as is shown in FIG. 1(b), the semiconductor substrate 10 is allowed to stand in air with relative humidity of 95% at a temperature of 30° C. for 30 minutes, so as to supply the surface of the resist film 11 with aqueous vapor 15. In this manner, the aqueous vapor 15 is adsorbed onto the surface of the strongly hydrophilic exposed area 11a of the resist film 11, and water is diffused into a deep portion, for example, a portion at a depth of 100 nm from the surface, of the exposed area 11a of the resist film 11. However, the aqueous vapor 15 is not adsorbed onto the unexposed area 11b of the resist film 11 because of its hydrophobic property.

Figure 2A:
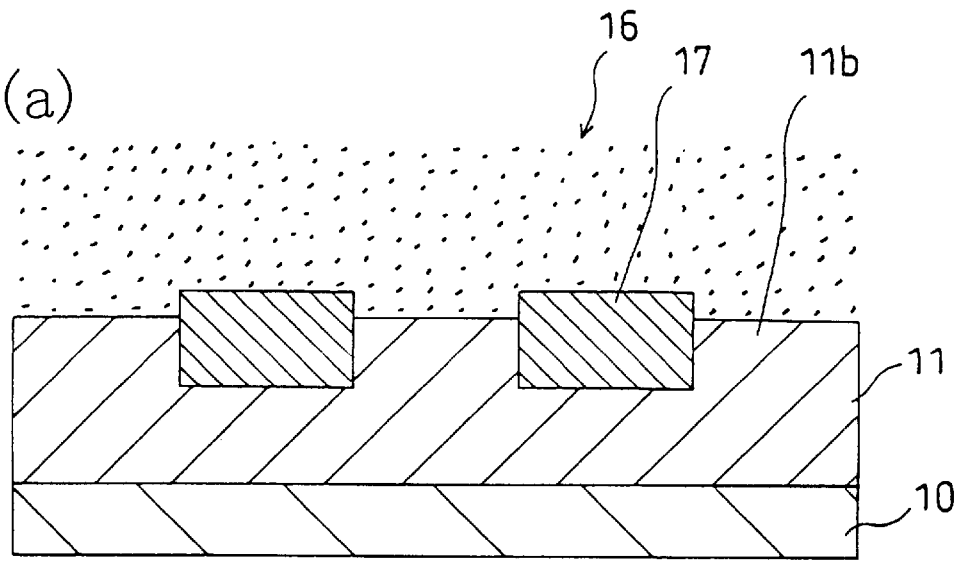
FIGS. 2(a) and 2(b) are sectional views for showing other procedures in the patterning method according to the first embodiment.
Figure 4:
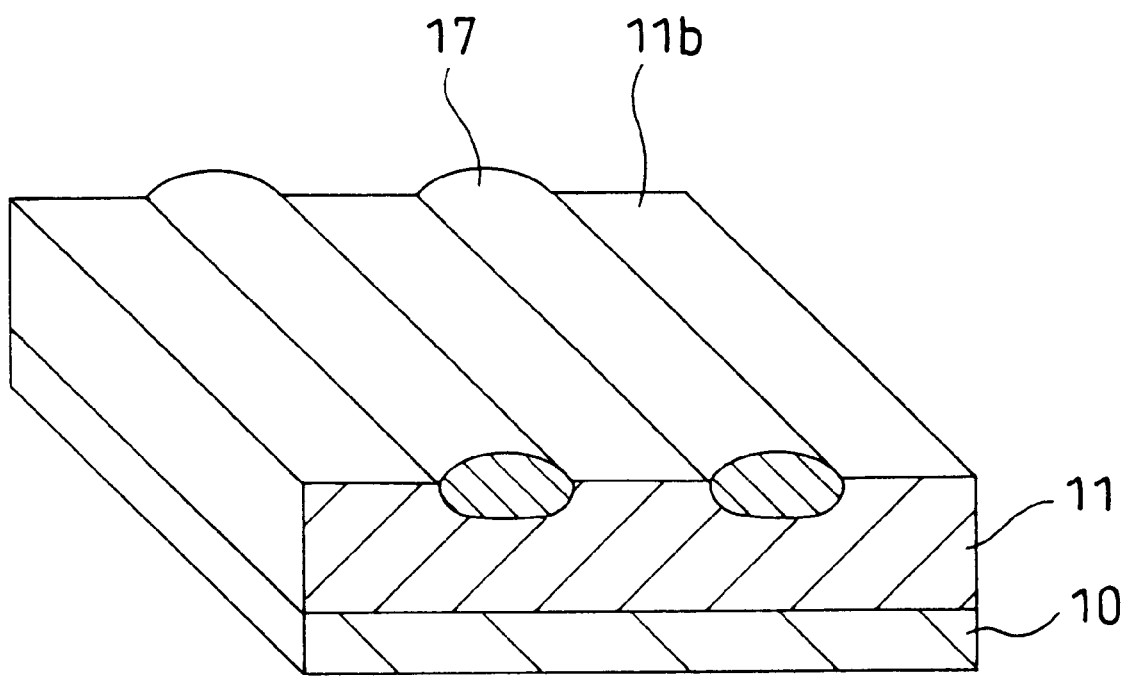
FIG. 4 is a sectional perspective view of a metal oxide film formed by the patterning method of the first embodiment.

Next, as is shown in FIG. 2(a), while retaining the semiconductor substrate 10 in the air with relative humidity of 95% at a temperature of 30° C., vapor 16 of methyltriethoxysilane (MTEOS) is sprayed on the surface of the resist film 11 for 3 minutes, thereby selectively forming an oxide film 17 on the surface of each exposed area 11a of the resist film 11. In this case, the acid ($H^+$) produced through the decomposition of the FISS group works as a catalyst for hydrolysis and condensation of MTEOS, resulting in forming the oxide film 17. The oxide film 17 is grown merely in a portion where the catalyst, that is, $H^+$, and water are both present. In this embodiment, since water is selectively adsorbed in the exposed area 11a of the resist film 11, the oxide film is not formed on the unexposed area 11b. In addition, since the recess is formed on the surface of the exposed area 11a, the oxide film 17 formed on the surface of the exposed area 11a is prevented from flowing. As a result, the thus formed oxide film 17 has an excellent shape as is shown in FIG. 4.

In the procedure shown in FIG. 1(b), the aqueous vapor 15 is supplied to the resist film 11 so that water can be diffused into the deep portion from the surface of the exposed area 11a of the resist film 11. Accordingly, the oxide film 17 is grown also toward the inside of the resist film 11, resulting in a large thickness of the oxide film 17.

Additionally, in the procedure shown in FIG. 2(a), MTEOS is supplied to the resist film 11 in the air with relative humidity of 95%. Accordingly, it is possible not only to prevent evaporation of water having been adsorbed by the resist film 11 but also to supply water required for forming the oxide film 17. Thus, the equilibrium of water can be retained, so that the resultant oxide film 17 attains a sufficiently large thickness for withstanding RIE (reactive ion etching) using $O_2$ plasma described below.

Figure 2B:
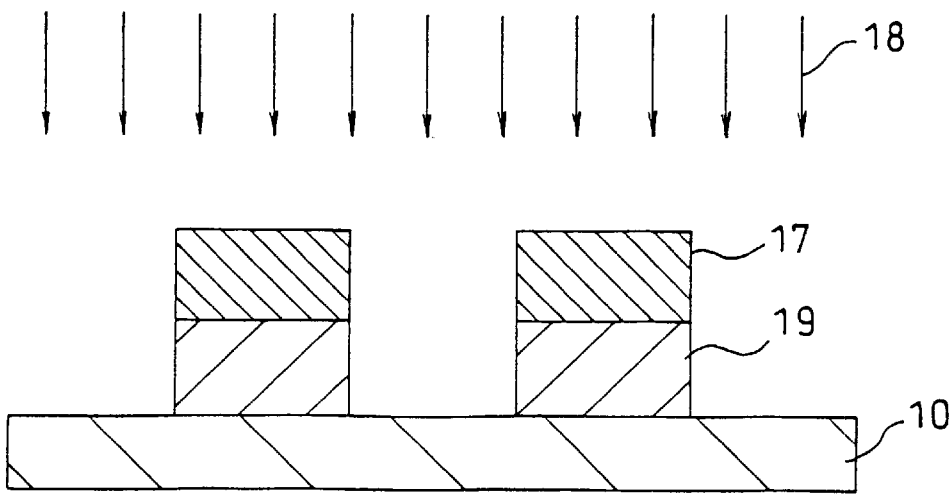

Next, as is shown in FIG. 2(b), the resist film 11 is subjected to the RIE using $O_2$ plasma 18 by using the oxide film 17 as a mask, thereby forming a resist pattern 19. In this case, the RIE using $O_2$ plasma is conducted by using a parallel plate RIE system under conditions of a power of 900 W, a pressure of 0.7 Pa and a flow rate of 40 SCCM.

In this manner, the contrast in the change of the property of the resist material from hydrophobicity to hydrophilicity after the exposure can be improved in this embodiment. As a result, the selectivity in adsorbing water of the exposed area 11a is increased, and hence, the oxide film 17 can be formed in an excellent shape.

Also, since the surface of the exposed area 11a is provided with the recess and then the oxide film 17 is grown thereon, the flow of the oxide film 17 can be avoided, resulting in obtaining a fine-line pattern having satisfactory edge roughness.

Additionally, since water is forcedly adsorbed by the exposed area 11a before growing the oxide film 17 thereon, the oxide film 17 can attain a sufficiently large thickness which is required for dry development by the RIE using $O_2$ plasma.

Although the copolymer represented by Chemical Formula 10 is used as the resist material in the first embodiment, the protecting group $R_{10}$ is not limited to that represented by Chemical Formula 11 but can be any of hydrophobic protecting groups which can be easily desorbed through the function of an acid, such as those represented by the following Chemical Formulas 13 through 24:

Chemical Formula 13:

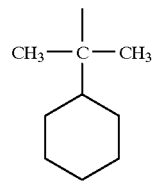

Chemical Formula 14:

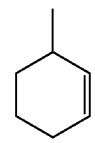

Chemical Formula 15:

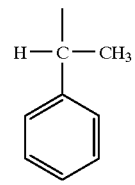

Chemical Formula 16:

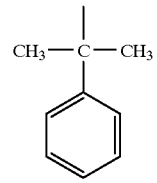

Chemical Formula 17:

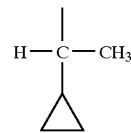

Chemical Formula 18:

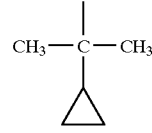

Chemical Formula 19:

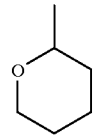

Chemical Formula 20:

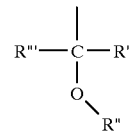

wherein R' and R" indicates an alkyl group, an alkenyl group or a phenyl group; and R'" indicates a hydrogen atom, an alkyl group, an alkenyl group or a phenyl group.

Chemical Formula 21:

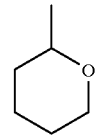

-continued

Chemical Formula 22:

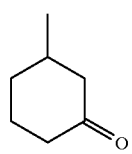

Chemical Formula 23:

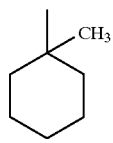

Chemical Formula 24:

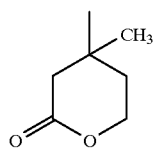

In addition, the copolymer used in the first embodiment includes a monomer from which the protecting group is desorbed at a polymerization ratio of 60 mol %. However, a copolymer having a polymerization ratio of 50 through 99 mol % can be used instead.

(Embodiment 2)

A method of forming a resist pattern according to a second embodiment of the invention will now be described.

As a resist material, a copolymer represented by Chemical Formula 25 is dissolved in diglyme. As a protecting group $R_{11}$ in Chemical Formula 25, the protecting group represented by Chemical Formula 13 is used.

Chemical Formula 25:

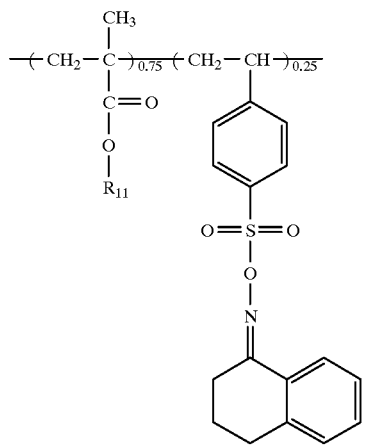

Similarly to the first embodiment, the resist material is coated by spin coating on a semiconductor substrate of silicon, and the coated resist material is heated at a temperature of 90° C. for 90 seconds, thereby forming a resist film with good adhesion having a thickness of 1 μm. Then, the resist film is irradiated with a KrF excimer laser, and the semiconductor substrate is then heated at a temperature of 100° C. for 1 minute. A reaction formula obtained through the heating process after the exposure of the resist material is shown as Chemical Formula 26.

Chemical Formula 26:

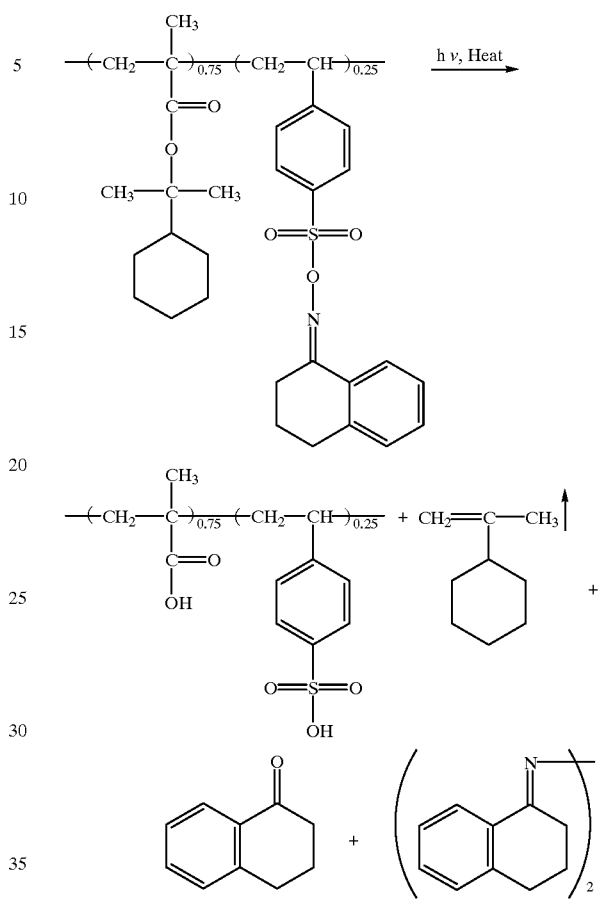

In the exposing process, a hydrophobic NISS group is decomposed to produce hydrophilic sulfonic acid, and in the heating process after the exposure, the protecting group represented by Chemical Formula 13 is desorbed through the function of the acid to produce hydrophilic carboxylic acid. Furthermore, as is shown in the reaction formula of Chemical Formula 26, the protecting group represented by Chemical Formula 13 is desorbed from the compound of Chemical Formula 25, so as to produce a hydrophobic byproduct and other byproducts, and the hydrophobic byproduct is evaporated during the heating process.

Through the aforementioned reactions, hydrophilic sulfonic acid is produced, hydrophilic carboxylic acid is produced through the desorption of the protecting group, and the hydrophobic byproduct is evaporated. Accordingly, the property of each exposed area can be changed from hydrophobicity into hydrophilicity to a larger extent than in the conventional resist material. In other words, the exposed area alone can attain a strong hydrophilic property on the resist film while retaining a strong hydrophobic property in an unexposed area.

Furthermore, in the heating process after the exposure, the volume of the exposed area of the resist film is decreased because of the desorption of the protecting group. As a result, a latent image is formed on the surface of each exposed area of the resist film. Observation of the surface of the resist film with an AFM reveals that a recess with a depth of 50 nm is formed on the surface of each exposed area of the resist film.

Then, the semiconductor substrate is allowed to stand in air with relative humidity of 95% at a temperature of 30° C.

for 30 minutes, so as to supply the surface of the resist film with aqueous vapor. Thus, the aqueous vapor is adsorbed onto the surface of the exposed area, so that water is diffused into a portion at a depth of 100 nm from the surface of the exposed area of the resist film.

Next, while retaining the semiconductor substrate in the air with relative humidity of 95% at a temperature of 30° C., vapor of MTEOS is sprayed on the surface of the resist film for 3 minutes, thereby selectively forming an oxide film on the surface of each exposed area. Also in this second embodiment, since water is selectively adsorbed by the exposed area of the resist film, the oxide film is not grown on the unexposed area, and the oxide film is prevented from flowing on the surface of the exposed area owing to the recess formed thereon. Thus, the oxide film can attain a satisfactory shape and excellent edge roughness.

Next, the resist film is subjected to RIE using $O_2$ plasma by using the oxide film selectively formed on the exposed area as a mask, thereby forming a fine-line resist pattern at high accuracy. In this case, the RIE using $O_2$ plasma is conducted by using a parallel plate RIE system under conditions of a power of 900 W, a pressure of 0.7 Pa and a flow rate of 40 SCCM.

In this manner, the contrast in the change of the property of the resist material from hydrophobicity into hydrophilicity after the exposure can be improved also in this embodiment. As a result, the selectivity in adsorbing water of the exposed area is increased, and hence, the oxide film can be formed in an excellent shape.

Also, since the surface of the exposed area is provided with the recess and then the oxide film is grown thereon, the flow of the oxide film can be avoided, resulting in obtaining a fine-line pattern having satisfactory edge roughness.

Additionally, since water is forcedly adsorbed by the exposed area before growing the oxide film thereon, the oxide film can attain a sufficiently large thickness which is required for the dry development by the RIE using $O_2$ plasma.

Although the copolymer represented by Chemical Formula 25 is used as the resist material in the second embodiment, the protecting group $R_{11}$ is not limited to that represented by Chemical Formula 13 but can be any of hydrophobic protecting groups which can be easily desorbed through the function of an acid, such as those represented by Chemical Formulas 11 and 14 through 24.

In addition, the copolymer used in the second embodiment includes a monomer from which the protecting group is desorbed at a polymerization ratio of 75 mol %. However, a copolymer having a polymerization ratio of 50 through 99 mol % can be used instead.

(Embodiment 3)

A method of forming a resist pattern according to a third embodiment of the invention will now be described.

As a resist material, a copolymer represented by Chemical Formula 27 is dissolved in diglyme. As a protecting group $R_{12}$ in Chemical Formula 27, the protecting group represented by Chemical Formula 11 is used.

Chemical Formula 27:

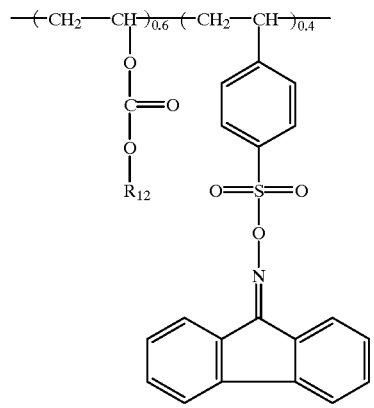

Similarly to the first embodiment, the resist material is coated by spin coating on a semiconductor substrate of silicon, and the coated resist material is heated at a temperature of 90° C. for 90 seconds, thereby forming a resist film with good adhesion having a thickness of 1 μm. Then, the resist film is irradiated with a KrF excimer laser, and the semiconductor substrate is then heated at a temperature of 140° C. for 1 minute. A reaction formula obtained through the heating process after the exposure of the resist material is shown as Chemical Formula 28.

Chemical Formula 28:

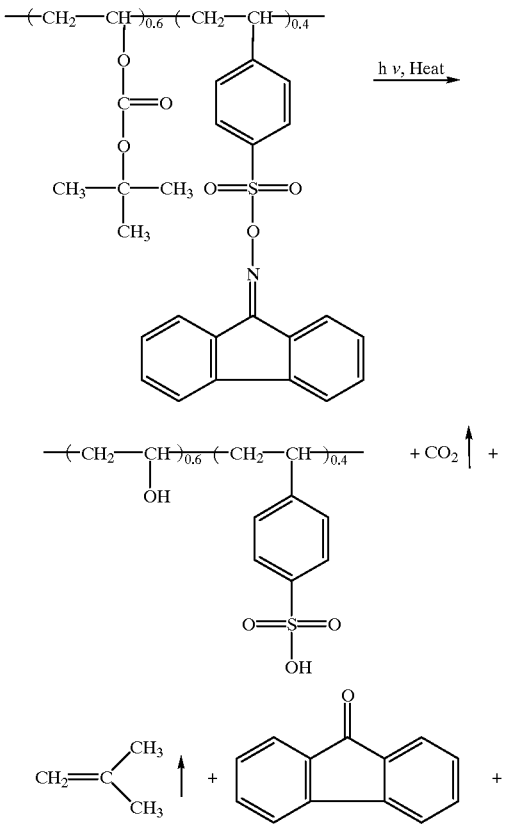

-continued

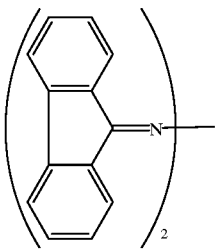

In the exposing process, a hydrophobic FISS group is decomposed to produce hydrophilic sulfonic acid, and in the heating process after the exposure, the protecting group represented by Chemical Formula 11 is desorbed through the function of the acid to produce hydrophilic vinyl alcohol. Furthermore, as is shown in the reaction formula of Chemical Formula 28, the protecting group represented by Chemical Formula 11 is desorbed from the compound of Chemical Formula 27, so as to produce a hydrophobic byproduct and other byproducts, and the hydrophobic byproduct is evaporated during the heating process.

Through the aforementioned reactions, hydrophilic sulfonic acid is produced, hydrophilic vinyl alcohol is produced through the desorption of the protecting group, and the hydrophobic byproduct is evaporated. Accordingly, the property of each exposed area can be changed from hydrophobicity into hydrophilicity to a larger extent than in the conventional resist material. In other words, the exposed area alone can attain a strong hydrophilic property on the resist film while retaining a strong hydrophobic property in an unexposed area.

Furthermore, in the heating process after the exposure, the volume of the exposed area of the resist film is decreased because of the desorption of the protecting group. As a result, a latent image is formed on the surface of each exposed area of the resist film. Observation of the surface of the resist film with an AFM reveals that a recess with a depth of 50 nm is formed on the surface of each exposed area of the resist film.

Then, the semiconductor substrate is allowed to stand in air with relative humidity of 95% at a temperature of 30° C. for 30 minutes, so as to supply the surface of the resist film with aqueous vapor. Thus, the aqueous vapor is adsorbed onto the surface of the exposed area, so that water is diffused into a portion at a depth of 100 nm from the surface of the exposed area of the resist film.

Next, while retaining the semiconductor substrate in the air with relative humidity of 95% at a temperature of 30° C., vapor of MTEOS is sprayed on the surface of the resist film for 3 minutes, thereby selectively forming an oxide film on the surface of each exposed area. Also in this third embodiment, since water is selectively adsorbed by the exposed area of the resist film, the oxide film is not grown on the unexposed area, and the oxide film is prevented from flowing on the surface of the exposed area owing to the recess formed thereon. Thus, the oxide film can attain a satisfactory shape and excellent edge roughness.

Next, the resist film is subjected to RIE using $O_2$ plasma by using the oxide film selectively formed on the exposed area as a mask, thereby forming a fine-line resist pattern. In this case, the RIE using $O_2$ plasma is conducted by using a parallel plate RIE system under conditions of a power of 900 W, a pressure of 0.7 Pa and a flow rate of 40 SCCM.

In this manner, the contrast in the change of the property of the resist material from hydrophobicity into hydrophilicity after the exposure can be improved also in this embodiment. As a result, the selectivity in adsorbing water of the exposed area is increased, and hence, the oxide film can be formed in an excellent shape.

Also, since the surface of the exposed area is provided with the recess and then the oxide film is grown thereon, the flow of the oxide film can be avoided, resulting in obtaining a fine-line pattern having satisfactory edge roughness.

Additionally, since water is forcedly adsorbed by the exposed area before growing the oxide film thereon, the oxide film can attain a sufficiently large thickness which is required for the dry development by the RIE using $O_2$ plasma.

Although the copolymer represented by Chemical Formula 27 is used as the resist material in the third embodiment, the protecting group $R_{12}$ is not limited to that represented by Chemical Formula 11 but can be any of the hydrophobic protecting groups which can be easily desorbed through the function of an acid, such as those represented by Chemical Formulas 13 through 24.

In addition, the copolymer used in the third embodiment includes a monomer from which the protection group is desorbed at a polymerization ratio of 60 mol %. However, a copolymer having a polymerization ratio of 50 through 99 mol % can be used instead.

(Embodiment 4)

A method of forming a resist pattern according to a fourth embodiment of the invention will now be described.

As a resist material, a copolymer represented by Chemical Formula 29 is dissolved in diglyme. As a protecting group $R_{13}$ in Chemical Formula 29, the protecting group represented by Chemical Formula 13 is used.

Chemical Formula 29:

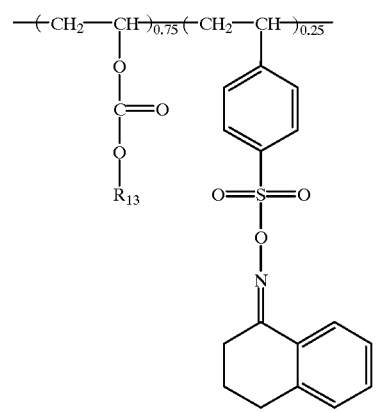

Similarly to the first embodiment, the resist material is coated by spin coating on a semiconductor substrate of silicon, and the coated resist material is heated at a temperature of 90° C. for 90 seconds, thereby forming a resist film with good adhesion having a thickness of 1 $\mu$m. Then, the resist film is irradiated with a KrF excimer laser, and the semiconductor substrate is then heated at a temperature of 100° C. for 1 minute. A reaction formula obtained through the heating process after the exposure of the resist material is shown as Chemical Formula 30.

Chemical Formula 30:

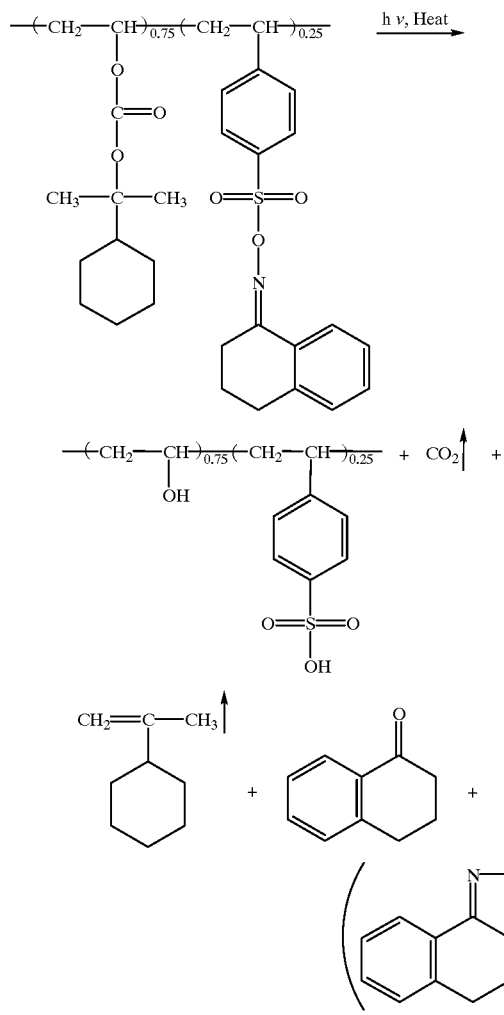

In the exposing process, a hydrophobic NISS group is decomposed to produce hydrophilic sulfonic acid, and in the heating process after the exposure, the protecting group represented by Chemical Formula 13 is desorbed through the function of the acid to produce hydrophilic vinyl alcohol. Furthermore, as is shown in the reaction formula of Chemical Formula 30, the protecting group represented by Chemical Formula 13 is desorbed from the compound of Chemical Formula 29, so as to produce a hydrophobic byproduct and other byproducts, and the hydrophobic byproduct is evaporated during the heating process.

Through the aforementioned reactions, hydrophilic sulfonic acid is produced, hydrophilic vinyl alcohol is produced through the desorption of the protecting group, and the hydrophobic byproduct is evaporated. Accordingly, the property of each exposed area can be changed from hydrophobicity into hydrophilicity to a larger extent than in the conventional resist material. In other words, the exposed area alone can attain a strong hydrophilic property on the resist film while retaining a strong hydrophobic property in an unexposed area.

Furthermore, in the heating process after the exposure, the volume of the exposed area of the resist film is decreased because of the desorption of the protecting group. As a result, a latent image is formed on the surface of each exposed area of the resist film. Observation of the surface of the resist film with an AFM reveals that a recess with a depth of 50 nm is formed on the surface of each exposed area of the resist film.

Then, the semiconductor substrate is allowed to stand in air with relative humidity of 95% at a temperature of 30° C. for 30 minutes, so as to supply the surface of the resist film with aqueous vapor. Thus, the aqueous vapor is adsorbed onto the surface of the exposed area, so that water is diffused into a portion at a depth of 100 nm from the surface of the exposed area of the resist film.

Next, while retaining the semiconductor substrate in the air with relative humidity of 95% at a temperature of 30° C., vapor of MTEOS is sprayed on the surface of the resist film for 3 minutes, thereby selectively forming an oxide film on the surface of each exposed area. Also in this fourth embodiment, since water is selectively adsorbed by the exposed area of the resist film, the oxide film is not grown on the unexposed area, and the oxide film is prevented from flowing on the surface of the exposed area owing to the recess formed thereon. Thus, the oxide film can attain a satisfactory shape and excellent edge roughness.

Next, the resist film is subjected to RIE using $O_2$ plasma by using the oxide film selectively formed on the exposed area as a mask, thereby forming a fine-line resist pattern. In this case, the RIE using $O_2$ plasma is conducted by using a parallel plate RIE system under conditions of a power of 900 W, a pressure of 0.7 Pa and a flow rate of 40 SCCM.

In this manner, the contrast in the change of the property of the resist material from hydrophobicity into hydrophilicity after the exposure can be improved also in this embodiment. As a result, the selectivity in adsorbing water of the exposed area is increased, and hence, the oxide film can be formed in an excellent shape.

Also, since the surface of the exposed area is provided with the recess and then the oxide film is grown thereon, the flow of the oxide film can be avoided, resulting in obtaining a fine-line pattern having satisfactory edge roughness.

Additionally, since water is forcedly adsorbed by the exposed area before growing the oxide film thereon, the oxide film can attain a sufficiently large thickness which is required for the dry development by the RIE using $O_2$ plasma.

Although the copolymer represented by Chemical Formula 29 is used as the resist material in the fourth embodiment, the protecting group $R_{13}$ is not limited to that represented by Chemical Formula 13 but can be any of hydrophobic protecting groups which can be easily desorbed through the function of an acid, such as those represented by Chemical Formulas 11 and 14 through 24.

In addition, the copolymer used in the fourth embodiment includes a monomer from which the protecting group is desorbed at a polymerization ratio of 75 mol %. However, a copolymer having a polymerization ratio of 50 through 99 mol % can be used instead.

In each of the first through fourth embodiments, a binary polymer is used as the copolymer. However, a ternary or higher polymer obtained by polymerizing the binary polymer with a group represented by Chemical Formula 31 or 32 can be used instead.

Chemical Formula 31:

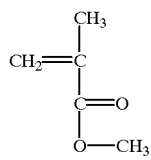

Chemical Formula 32:

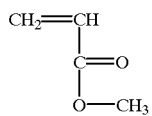

(Embodiment 5)

A method of forming a resist pattern according to a fifth embodiment of the invention will now be described.

As a resist material, a copolymer represented by Chemical Formula 33 is dissolved in diglyme.

Chemical Formula 33:

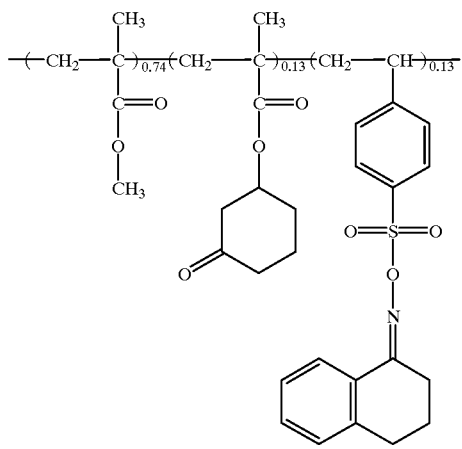

Similarly to the first embodiment, the resist material is coated by spin coating on a semiconductor substrate of silicon, and the coated resist material is heated at a temperature of 90° C. for 90 seconds, thereby forming a resist film with a thickness of 0.6 $\mu$m (which process is hereinafter referred to as the resist film forming process).

Then, the resist film is irradiated with an ArF excimer laser so that an area 3 mm square is exposed at an exposure of 40 mJ/cm$^2$ (which process is hereinafter referred to as the exposing process).

Next, after the exposure, the semiconductor substrate is subjected to a heat treatment at a temperature of 100° C. for 30 minutes (which process is hereinafter referred to as the heating process). A reaction formula obtained through this heating process is shown as Chemical Formula 34:

Chemical Formula 34:

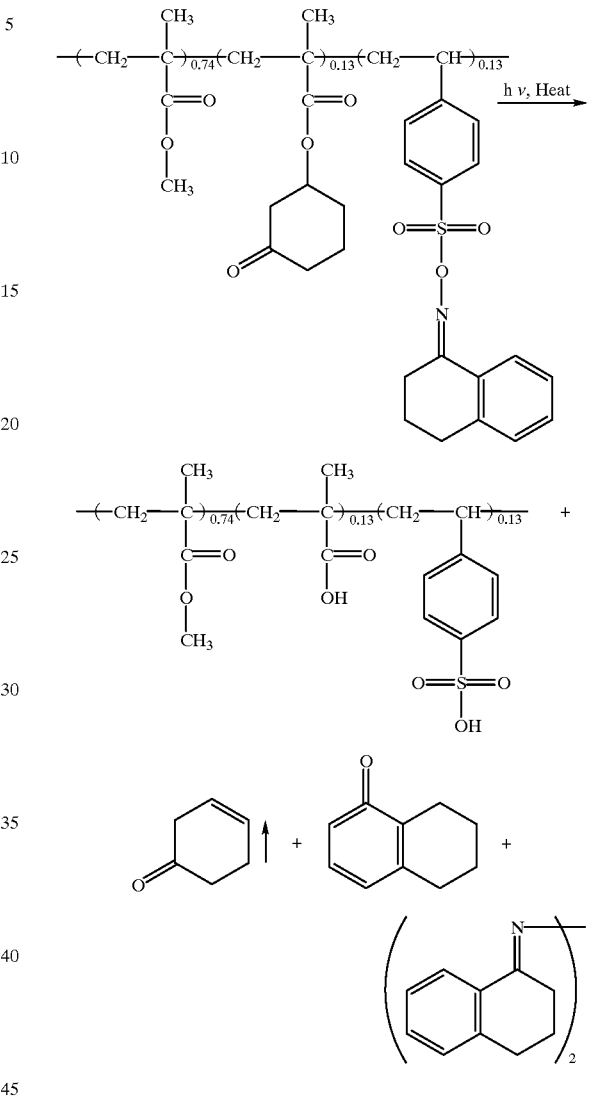

In the exposing process, a hydrophobic NISS group is decomposed to produce hydrophilic sulfonic acid, and in the heating process after the exposure, the protecting group represented by Chemical Formula 22 is desorbed from the compound of Chemical Formula 33 through the function of the acid to produce hydrophilic carboxylic acid. Furthermore, as is shown in the reaction formula of Chemical Formula 34, the protecting group represented by Chemical Formula 22 is desorbed from the compound of Chemical Formula 33, so as to produce a hydrophobic byproduct and other byproducts, and the hydrophobic byproduct is evaporated during the heating process.

Then, the semiconductor substrate is allowed to stand in air with relative humidity of 82% at a temperature of 34° C. for 20 minutes, so as to supply the surface of the resist film with aqueous vapor (which process is hereinafter referred to as the aqueous vapor treatment process).

Next, while retaining the semiconductor substrate in the air with relative humidity of 82% at a temperature of 34° C., vapor of MTEOS, that is, metal alkoxide, is sprayed on the surface of the resist film for 3 through 10 minutes, thereby selectively forming an oxide film on the surface of each exposed area (which process is hereinafter referred to as the metal alkoxide treatment process).

Also in this fifth embodiment, since water is selectively adsorbed by the exposed area of the resist film, the oxide film is not grown on an unexposed area, and the oxide film formed on the surface of the exposed area is prevented from flowing due to a recess formed on the exposed area. As a result, the resultant oxide film can attain excellent edge roughness and a satisfactory shape.

Next, the resist film is subjected to RIE using $O_2$ plasma by using the oxide film selectively formed on the exposed area as a mask, thereby forming a fine-line resist pattern with high accuracy. In this case, the RIE using $O_2$ plasma is conducted by using a parallel plate RIE system under conditions of a power of 900 W, a pressure of 0.7 Pa and a flow rate of 40 SCCM.

In this manner, the contrast in the change of the property of the resist material from hydrophobicity into hydrophilicity after the exposure is improved in the fifth embodiment, so that the selectivity in adsorbing water of the exposed area can be improved. Thus, the resultant oxide film selectively formed on the exposed area can attain a satisfactory shape, resulting in forming a resist pattern with high resolution.

Now, an evaluation test for evaluating the patterning method according to this embodiment will be described.

First, a resist material obtained by dissolving the copolymer represented by Chemical Formula 33 in diglyme is subjected to the resist film forming process and the exposing process. Then, with the heating process omitted, the aqueous vapor treatment process and the metal alkoxide treatment process are effected on the resist film, thereby giving a sample 1.

Also, a resist material obtained by dissolving the copolymer represented by Chemical Formula 33 in diglyme is subjected to the resist film forming process, the exposing process, the heating process, the aqueous vapor treatment process and the metal alkoxide treatment process, thereby giving a sample 2.

Furthermore, a resist material obtained by dissolving a copolymer of NISS and MMA represented by Chemical Formula 35 in diglyme, which is described above as the conventional material, is subjected to the resist film forming process and the exposing process. Then, with the heating process omitted, the aqueous vapor treatment process and the metal alkoxide process are effected on the obtained resist film, thereby giving a sample 3.

Chemical Formula 35:

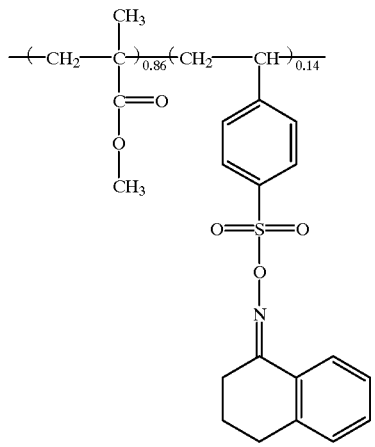

In order to evaluate the amount of the thus formed oxide film, the absorption peak of Si—$CH_3$ is measured in each of the samples 1, 2 and 3 by using an FTIR (Fourier transform infrared spectroscopic analyzer), thereby obtaining the amount of produced polysiloxane. Specifically, the amount of polysiloxane produced in an area 3 mm square in an exposed area and an unexposed area of each of the samples 1, 2 and 3 is measured by using the FTIR.

Figure 5:
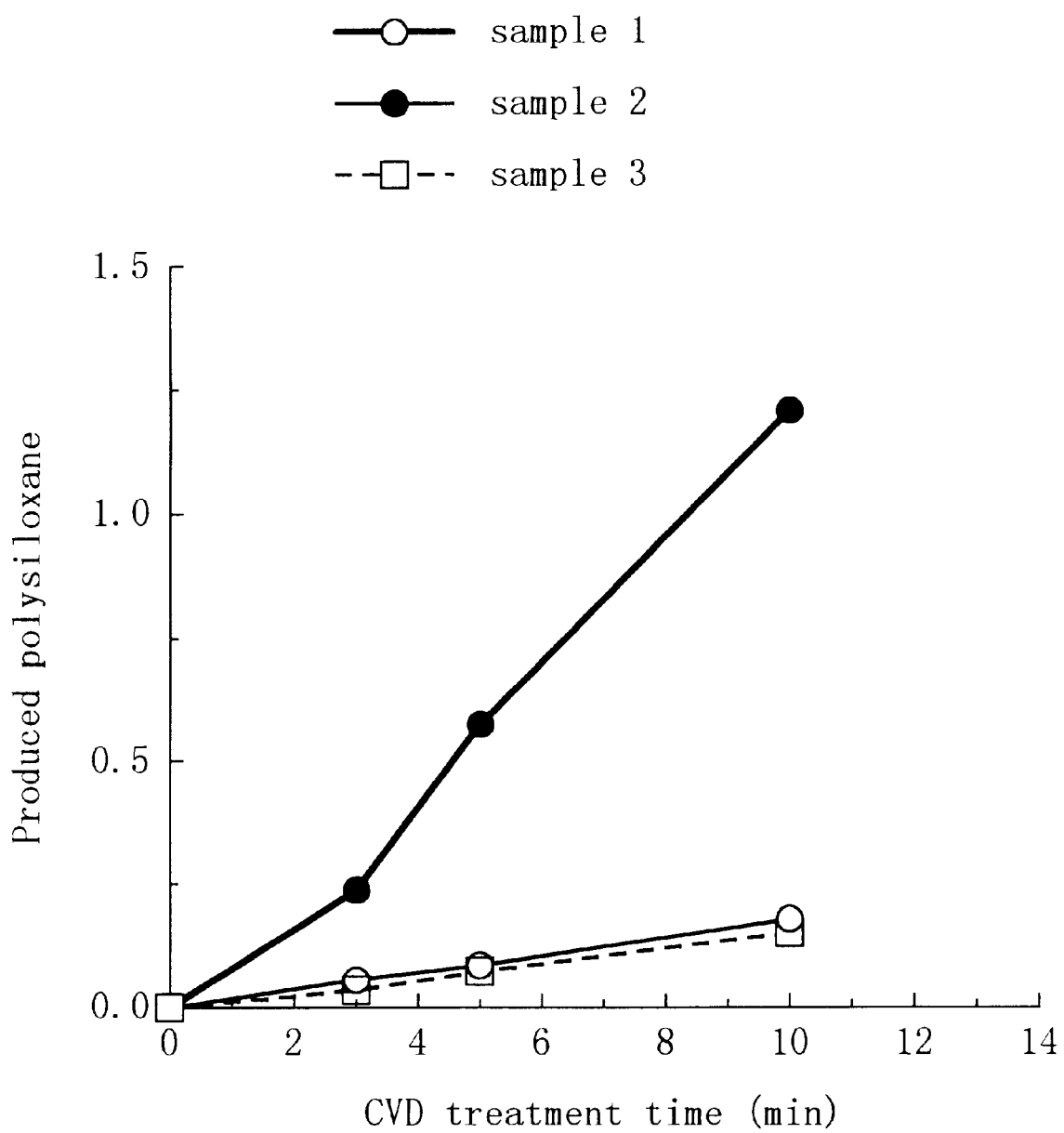
FIG. 5 is a graph showing the results of an evaluation test on samples 1, 2 and 3 for evaluating a patterning method of a sixth embodiment of the invention, wherein the relationship between CVD treatment time and an amount of produced polysiloxane in each sample is shown.
Figure 6A:
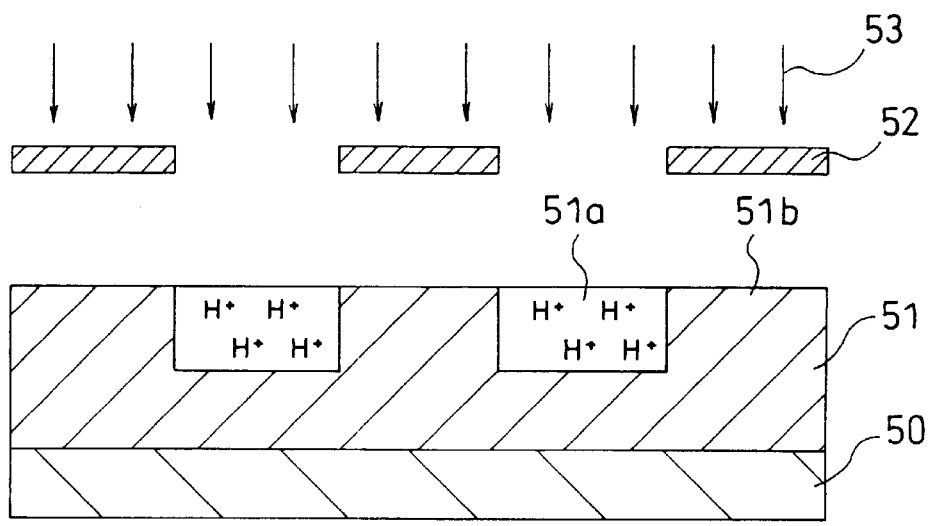
FIGS. 6(a) and 6(b) are sectional views for showing procedures in a conventional patterning method.
Figure 6B:
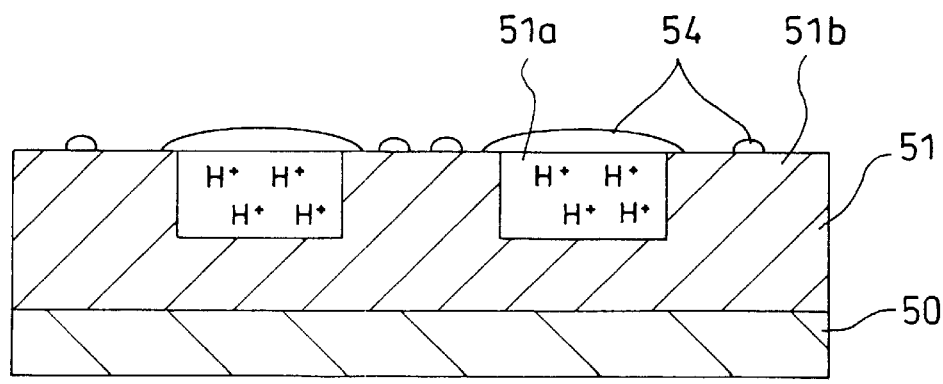
Figure 7A:
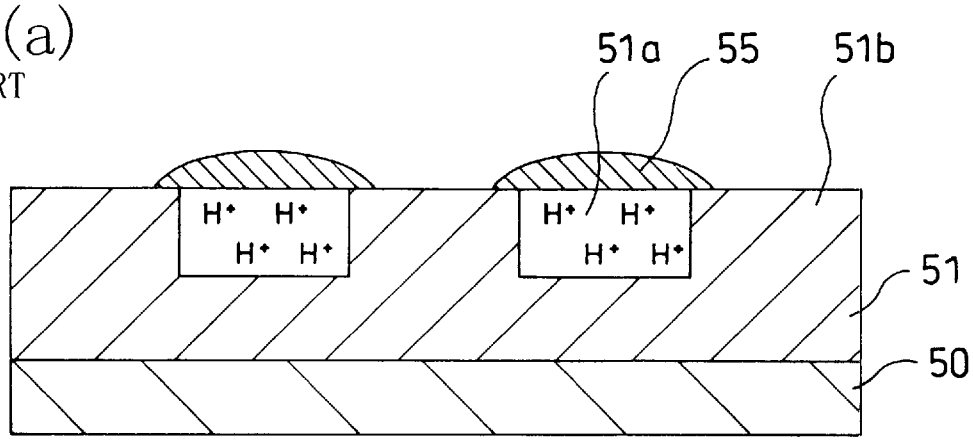
FIGS. 7(a) and 7(b) are sectional views for showing other procedures in the conventional patterning method.
Figure 7B:
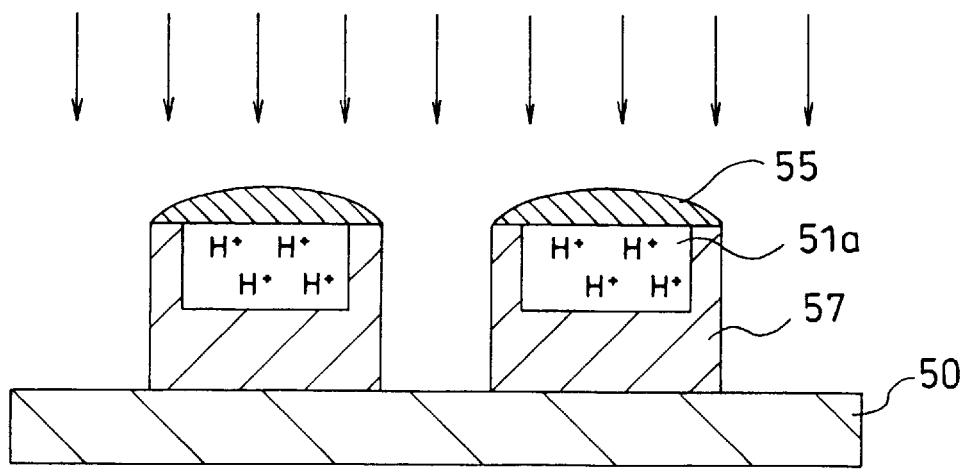
Figure 8:
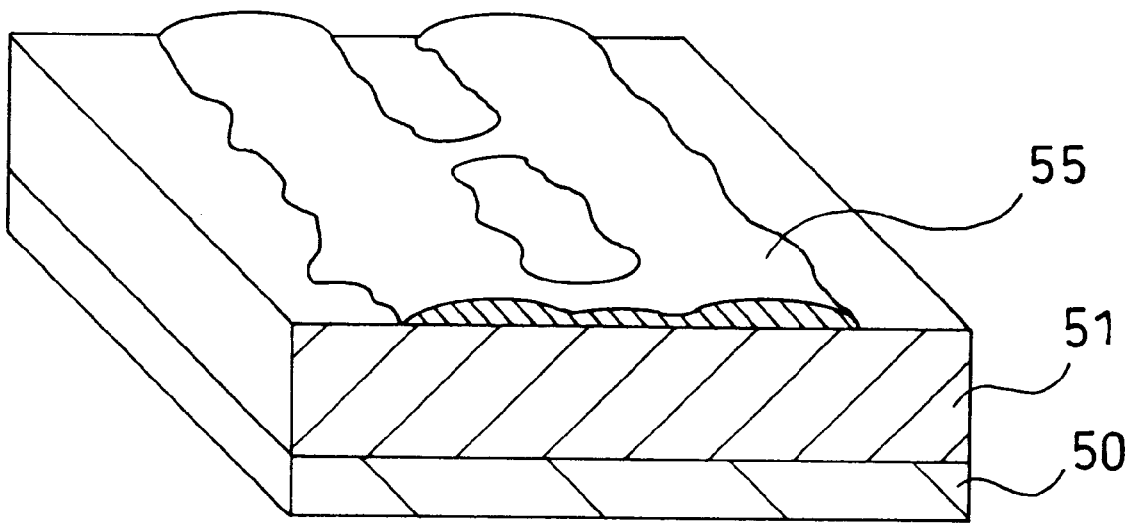
FIG. 8 is a sectional perspective view for illustrating a problem of the conventional patterning method.

The amount of polysiloxane produced in the exposed area of each sample is shown in FIG. 5. The produced polysiloxane is remarkably large in amount in the sample 2, which is obtained by conducting the heating process after the exposing process on the resist material including the copolymer represented by Chemical Formula 33, as compared with the samples 1 and 3. As described above, through the heating process after the exposing process, the protecting group is desorbed to produce hydrophilic carboxylic acid. As a result, the resist film attains a strong hydrophilic property, which accelerates adsorption of water. This is probably the reason because the remarkably large amount of polysiloxane is produced in the sample 2 as compared with the samples 1 and 3.

Furthermore, in the unexposed area of any of the samples 1, 2 and 3, no polysiloxane is produced. This is because the unexposed area has a sufficient hydrophobic property, and hence, not only water is not adsorbed by the unexposed area but also an acid working as the catalyst does not exist on the unexposed area.

Although the copolymer represented by Chemical Formula 33 is used as the resist material in the fifth embodiment, the protecting group is not limited to that represented by Chemical Formula 22 but can be any of hydrophobic protecting groups which can be easily desorbed through the function of an acid, such as those represented by Chemical Formulas 11, 13 through 21, 23 and 24.

(Embodiment 6) A method of forming a resist pattern according to a sixth embodiment of the invention will now be described.

As a resist material, a copolymer represented by Chemical Formula 36 is dissolved in diglyme.

Chemical Formula 36:

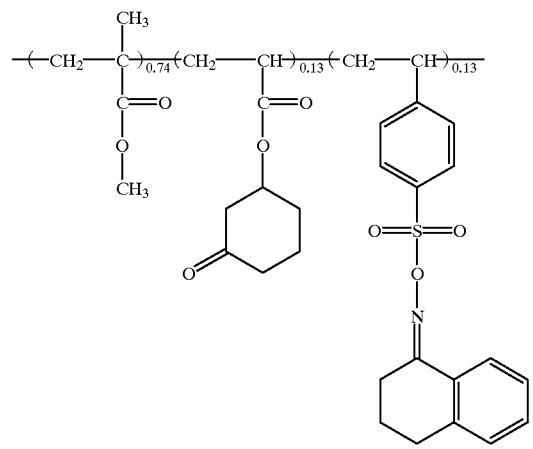

Similarly to the first embodiment, the resist material is coated by spin coating on a semiconductor substrate of silicon, and the coated resist material is heated at a temperature of 90° C. for 90 seconds, thereby forming a resist film having a thickness of 0.6 μm. Then, the resist film is irradiated with an ArF excimer laser, and the semiconductor substrate is then heated at a temperature of 100° C. for 30 minutes.

In the exposing process, a hydrophobic NISS group is decomposed to produce hydrophilic sulfonic acid, and in the heating process after the exposure, the protecting group represented by Chemical Formula 22 is desorbed through the function of the acid to produce hydrophilic vinyl alcohol.

Then, the semiconductor substrate is allowed to stand in air with relative humidity of 82% at a temperature of 34° C. for 20 minutes, so as to supply the surface of the resist film with aqueous vapor.

Next, while retaining the semiconductor substrate in the air with relative humidity of 82% at a temperature of 34° C., vapor of MTEOS is sprayed on the surface of the resist film for 3 through 10 minutes, thereby selectively forming an oxide film on the surface of each exposed area.

Also in this sixth embodiment, since water is selectively adsorbed by each exposed area of the resist film, the oxide film is not grown on an unexposed area, and the oxide film is prevented from flowing on the surface of the exposed area owing to a recess formed thereon. Thus, the oxide film can attain a satisfactory shape and excellent edge roughness.

Next, the resist film is subjected to RIE using $O_2$ plasma by using the oxide film selectively formed on the exposed area as a mask, thereby forming a fine-line resist pattern. In this case, the RIE using $O_2$ plasma is conducted by using a parallel plate RIE system under conditions of a power of 900 W, a pressure of 0.7 Pa and a flow rate of 40 SCCM.

In this manner, the contrast in the change of the property of the resist material from hydrophobicity into hydrophilicity after the exposure can be improved also in this embodiment. As a result, the selectivity in absorbing water of the exposed area is increased, and hence, the oxide film can be formed in an excellent shape. Thus, the resist pattern having high resolution can be formed.

Although the copolymer represented by Chemical Formula 36 is used as the resist material in the sixth embodiment, the protecting group is not limited to that represented by Chemical Formula 22 but can be any of hydrophobic protecting groups which can be easily desorbed through the function of an acid, such as those represented by Chemical Formulas 11, 13 through 21, 23 and 24.

In each of the first through sixth embodiments, MTEOS is used as metal alkoxide, but MTEOS can be replaced with another metal alkoxide, such as $Si(OCH_3)_4$, $CH_3Si(OCH_3)_3$, $Si(OC_2H_5)_4$, $Ti(OC_2H_5)_4$, $Ge(OC_2H_5)_4$, $Al(OC_2H_5)_3$, $Zr(OC_2H_5)_3$ in a vapor or liquid form.

Also in each of the first through sixth embodiments, the dry development is effected by the RIE using $O_2$ plasma, which can be replaced with ECR (electron cyclotron resonance etching) using $O_2$ plasma or the like.

Furthermore, in each of the first through sixth embodiments, any of a KrF excimer laser, an ArF excimer laser or X-ray can be appropriately used as a light source for the exposure.

Moreover, in each of the first through sixth embodiments, the semiconductor substrate is allowed to stand in aqueous vapor in the process of diffusing water on and into the exposed area of the resist film, but the resist film on the semiconductor substrate can be supplied with water in a liquid form instead. However, water is more rapidly diffused so as to enlarge the thickness of the oxide film when supplied in a gas phase than when supplied in a liquid phase.

What is claimed is:

1. A patterning method comprising:

a first step of forming a resist film by coating a patterning material, which comprises a polymer including a first group for producing an acid through exposure and a second group which is decomposed into a hydrophilic group under an atmosphere of said acid, on a semiconductor substrate;

a second step of producing said acid in an exposed area of said resist film by irradiating said resist film with an energy beam;

a third step of changing said second group present in the exposed area of said resist film into the hydrophilic group by heating said resist film, on which a pattern has been exposed through said second step;

a fourth step of forming a metal oxide film on a surface of the exposed area by supplying metal alkoxide onto the surface of the exposed area of said resist film, which has been heated in said third step; and a fifth step of forming a resist pattern of said resist film by dry etching said resist film by using said metal oxide film as a mask.

2. The patterning method of claim 1 further comprising, between said third step and said fourth step, a step of allowing the exposed area of said resist film to adsorb water.

3. The patterning method of claim 1, wherein said polymer is represented by a general formula:

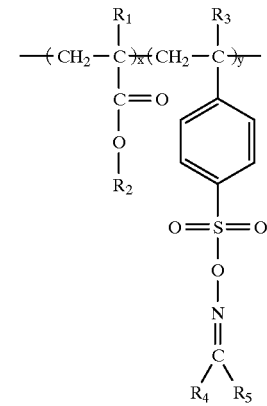

wherein $R_1$ indicates a hydrogen atom or an alkyl group; $R_2$ indicates a hydrophobic protecting group which is easily desorbed through a function of said acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of $0<x<1$; and y satisfies a relationship of $0<y<1$.

4. The patterning method of claim 3, wherein $R_4$ and $R_5$ in said general formula together indicate a cyclic alkyl or alkenyl group having two or more phenyl groups.

5. The patterning method of claim 3, wherein x and y in said general formula satisfy relationships of $x+y=1$ and $0.01 \leq y \leq 0.5$.

6. The patterning method of claim 1,
wherein said polymer is represented by a general formula:

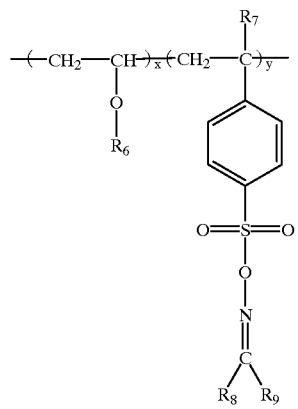

wherein $R_6$ indicates a hydrophobic protecting group which is easily desorbed through a function of said acid; $R_7$ indicates a hydrogen atom or an alkyl group; $R_8$ and $R_9$ independently indicate a hydrogen atom, an alkyl group, a phenyl group or an alkenyl group, or together indicate a cyclic alkyl group, a cyclic alkenyl group or a cyclic alkyl or alkenyl group having a phenyl group; x satisfies a relationship of 0<x<1; and y satisfies a relationship of 0<y<1.

7. The patterning method of claim 6,
wherein $R_8$ and $R_9$ in said general formula together indicate a cyclic alkyl or alkenyl group having two or more phenyl groups.

8. The patterning method of claim 6,
wherein x and y in said general formula satisfy relationships of x+y=1 and $0.01 \leq y \leq 0.5$.

9. The patterning method of claim 1,
wherein said polymer is represented by a general formula:

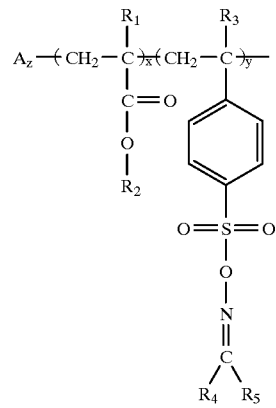

wherein $A_z$ indicates a group of an organic compound; $R_1$ indicates a hydrogen atom or an alkyl group; $R_2$ indicates a hydrophobic protecting group which is easily desorbed through a function of said acid; $R_3$ indicates a hydrogen atom or an alkyl group; $R_4$ and $R_5$ independently indicate a hydrogen atom, an alkyl group, a phenyl group or an alkenyl group, or together indicate a cyclic alkyl group, a cyclic alkenyl group, or a cyclic alkyl or alkenyl group having a phenyl group; and x, y and z satisfy a relationship of x+y+z=1.

10. The patterning method of claim 9,
wherein $R_4$ and $R_5$ in said general formula together indicate a cyclic alkyl or alkenyl group having two or more phenyl groups.

11. The patterning method of claim 9,
wherein y in said general formula satisfies a relationship of $0.01 \leq y \leq 0.5$.

12. The patterning method of claim 1,
wherein said polymer is represented by a general formula:

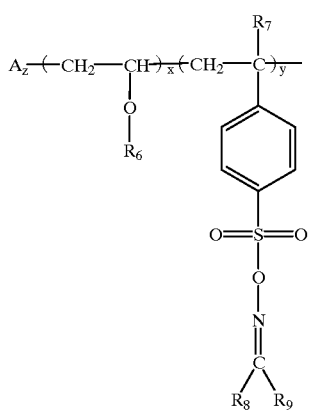

wherein $A_z$ indicates a group of an organic compound; $R_6$ indicates a hydrophobic protecting group which is easily desorbed through a function of said acid; $R_7$ indicates a hydrogen atom or an alkyl group; $R_8$ and $R_9$ independently indicate a hydrogen atom, an alkyl group, a phenyl group or an alkenyl group, or together indicate a cyclic alkyl group, a cyclic alkenyl group, or a cyclic alkyl or alkenyl group having a phenyl group; and x, y and z satisfy a relationship of x+y+z=1.

13. The patterning method of claim 12,
wherein $R_8$ and $R_9$ in said general formula together indicate a cyclic alkyl or alkenyl group having two or more phenyl groups.

14. The patterning method of claim 12,
wherein y in said general formula satisfies a relationship of $0.01 \leq y \leq 0.5$.

* * * * *